United States Patent [19]
Gosain et al.

[11] Patent Number: 5,627,085
[45] Date of Patent: May 6, 1997

[54] METHOD FOR HYDROGENATING A POLYCRYSTAL SILICON LAYER OF A THIN FILM TRANSISTOR

[75] Inventors: Dharam P. Gosain; Jonathan Westwater; Setsuo Usui, all of Kanagawa, Japan

[73] Assignee: Sony Corporation, Tokyo, Japan

[21] Appl. No.: 499,651

[22] Filed: Jun. 7, 1995

[30] Foreign Application Priority Data

Jul. 8, 1994 [JP] Japan ................... 6-180734

[51] Int. Cl.$^6$ ................... H01L 21/265; H01L 21/20; H01L 21/02
[52] U.S. Cl. ................... 438/162; 438/798; 438/766
[58] Field of Search ................... 437/21, 24, 40 TFI, 437/40 TFT, 41 TFI, 41 TFT, 101, 241

[56] References Cited

U.S. PATENT DOCUMENTS 5,053,347  10/1991  Wu ................... 437/101
5,150,181  9/1992  Takeda et al. ................... 257/57
5,455,182  10/1995  Nishimoto et al. ................... 437/21

Primary Examiner—John Niebling
Assistant Examiner—Brian K. Dutton
Attorney, Agent, or Firm—Hill, Steadman & Simpson

[57] ABSTRACT

The present invention improves a current—voltage characteristic by perfectly eliminating defects in the polycrystal silicon layer of TFT by hydrogenation. In the first process, hydrogen is doped into the polycrystal silicon layer 16 of TFT 1 by the hydrogen plasma doping method to eliminate a greater part of the defects in the polycrystal silicon layer 16. Thereafter, in the second process, after an amorphous silicon nitride film 23 including hydrogen is formed on the polycrystal silicon layer 16 or on the stopper layer 17 provided on the polycrystal silicon layer 16, hydrogen is released from the amorphous silicon nitride film 23 including hydrogen by the annealing process and such released hydrogen is then diffused into the polycrystal silicon layer 16 in order to eliminate remaining defects in the polycrystal silicon layer 16.

4 Claims, 3 Drawing Sheets

METHOD FOR HYDROGENATING A POLYCRYSTAL SILICON LAYER OF A THIN FILM TRANSISTOR

BACKGROUND OF THE INVENTION

1. Field of the Invention

The present invention relates to a method of hydrogenation of a thin film transistor (hereinafter abbreviated as TFT) to eliminate defects within a polycrystal silicon layer of TFT.

2. Description of Related Art

A polycrystal silicon TFT using polycrystal silicon as a channel region has been investigated widely in these years in view of introduction into an LCD (liquid crystal display) where an address circuit and a clock circuit are mounted on a substrate.

Much interest is taken in the process to form polycrystal silicon by the laser annealing method because this process enables forming of polycrystal silicon with a low temperature process on an economical substrate consisting of glass, plastics or ceramics.

Next, a structure of TFT will be explained with reference to a schematic cross-sectional view of FIG. 3. FIG. 3 illustrates a structure of a bottom gate type TFT under the condition before a passivation film is formed.

As shown in FIG. 3, a gate electrode 52 is formed on a glass substrate 51 and an oxide film 53 is formed on the surface of this gate electrode 52. A silicon nitride film 54 and a silicon oxide film 55 are then stacked thereon covering the anode oxide film 53.

On the silicon oxide film 55, a polycrystal silicon layer 56 polycrystallized by the laser crystallization method is formed. Moreover, a stopper layer 57 consisting of silicon oxide is formed on the polycrystal silicon layer 56 provided at the upper part of the gate electrode 52.

At both sides of the stopper layer 57, doped layers 58, 59 which will become the source/drain regions are formed and the polycrystal silicon layer 56 provided at the lower side of the stopper layer 57 becomes a channel region 60. The doped layers 58, 59 are formed, for example, of polycrystal silicon including an n-type impurity [phosphorus (P), arsenic (As) or antimony (Sb)].

These doped layers 58, 59 are respectively connected with the source/drain electrodes 61, 62.

The above-mentioned laser crystallization method is applied for quick crystallization of amorphous silicon layer, resulting in that crystal grain size of formed polycrystal silicon becomes small. Therefore, many grain boundaries exist. Therefore, it is required to reduce the defects of grain boundaries to manufacture a TFT having a lower leakage current.

Hydrogenation is one of such laser crystallization methods. The hydrogenation method is classified into the method where hydrogen is doped using hydrogen plasma and the method where hydrogen is diffused from amorphous silicon nitride film including hydrogen.

A method for hydrogenation of polycrystal silicon layer 56 of the TFT 50 explained with reference to FIG. 3 will then be explained hereunder.

With the plasma doping method using hydrogen plasma, hydrogen is doped, through the stopper layer 57 consisting of silicon oxide, to the polycrystal silicon layer 56 where a channel region 60 is formed. As a result, the polycrystal silicon layer 56 is hydrogenated.

As another method, after amorphous silicon nitride film including hydrogen (not illustrated) is formed, hydrogen included in this film is then diffused, through the stopper layer 57, to the polycrystal silicon layer 56 where the channel region 60 is formed. As a result, the polycrystal silicon layer 56 is hydrogenated.

Next, change of drain current—gate voltage characteristic (hereinafter described as current—voltage characteristic) of TFT 50 before or after the hydrogenation of polycrystal silicon layer 56 will be explained on the basis of the current—voltage characteristic of FIG. 4. In this figure, a drain current is plotted on the vertical axis, while a gate voltage on the horizontal axis.

As shown in the figure, the current—voltage characteristic of TFT 50 before the hydrogenation is indicated by a solid line (a). That is, increase of drain current is small with respect to the increase of a positive voltage applied. This fact suggests bad switching characteristic of TFT.

Therefore, after the hydrogenation process for about 60 minutes, the current—voltage characteristic of TFT 50 has been investigated again. As a result, this current—voltage characteristic is indicated by a broken line (b). As explained above, increase of drain current becomes larger with respect to the increase of the positive voltage applied. Namely, the ON/OFF current ratio becomes as much as six orders of magnitude, resulting in a larger gradient of the drain current—gate voltage curve, depending on decrease of a leak current because uncoupled hands of the grain boundaries are terminated by hydrogen.

For example, the effective diffusion coefficient of hydrogen in the silicon oxide is defined as $10^{-10} cm^2/s$ and the effective diffusion coefficient of hydrogen in the polycrystal silicon as $10^{-12} cm_2/s$ (1/10 of the value of the single crystal silicon). In this case, 10 seconds are required for hydrogenation of the polycrystal silicon film having a thickness of 30 nm.

The hydrogenation of the polycrystal silicon layer of TFT further requires a time longer than the abovementioned calculated time due to a delay of the diffusion of hydrogen since the polycrystal silicon layer is partly covered with the doped layer and source/drain electrode, etc. When it is taken into consideration, the hydrogenation time can be calculated as $2.5 \times 10^3$ seconds, which almost matches the result of experiments.

When hydrogenation is further carried out, hydrogen in the polycrystal silicon layer becomes excessive, deteriorating the current—voltage characteristic.

However, the prior art methods explained above have the problems as will be explained hereunder.

1. Hydrogenation using hydrogen plasma generally reduces defects in the polycrystal silicon layer but cannot perfectly eliminate such defects because the hydrogen plasma certainly reduces defects but also generates new defects.

2. When TFT is exposed to the plasma for about 60 minutes or longer, deterioration of transistor characteristic can be observed because the channel region is irradiated continuously, while it is exposed to the plasma, to energy particles or ultraviolet ray which may generate defects through the stopper layer.

Here, characteristic change of TFT by irradiation of the ultraviolet ray will be explained hereunder with reference to the current—voltage characteristic change diagram of FIG. 5.

As shown in FIG. 5, a broken line (a) indicates the current—voltage characteristic of TFT hydrogenated by the plasma doping method using hydrogen plasma after irradiation of ultraviolet ray (mercury lamp, principal wavelength λ=253.7 nm, 184.9 nm).

Moreover, a chain line (b) indicates the current—voltage characteristic after irradiation of the ultraviolet ray. As will be obvious from this figure, the current—voltage characteristic of TFT is deteriorated by irradiation of the ultraviolet rays.

A solid line (c) indicates also the current—voltage characteristic of TFT after hydrogenation by the plasma doping using hydrogen plasma. As is obvious from this characteristic, the current—voltage characteristic of TFT recovers depending on the hydrogenation process.

As explained above, FIG. 5 suggests that defects may be generated in the polycrystal silicon layer of TFT by irradiation of the ultraviolet ray.

As the hydrogen plasma used for hydrogenation, an intensive ultraviolet ray in the range from 110 nm to 162 nm is emitted. Since an energy of such ultraviolet ray is higher than the value discussed above, it can be sufficiently assumed that TFT may be damaged. Therefore, quality of TFT hydrogenated by the plasma doping using hydrogen plasma is deteriorated.

3. In the method for hydrogenating the polycrystal silicon layer using amorphous silicon nitride film including hydrogen (a-SiNx:H), since the amount of hydrogen released from the inside of the amorphous silicon nitride film is insufficient, defects cannot be eliminated perfectly by hydrogenation of the polycrystal silicon layer with the laser annealing process.

SUMMARY OF THE INVENTION

It is therefore an object of the present invention to provide a method for hydrogenation of TFT which is superior to improvement in the TFT characteristic through elimination of defects of polycrystal silicon layer to form a channel region of TFT.

The present invention relates to a method for hydrogenation of TFT in order to achieve the abovementioned object.

Namely, in the first process, hydrogen is doped into the polycrystal silicon layer of TFT by the hydrogen plasma doping method to eliminate almost all defects in the polycrystal silicon layer. Thereafter, in the second process, after amorphous silicon nitride film including hydrogen is deposited on the stopper layer consisting of silicon oxide provided on the polycrystal silicon layer or on the polycrystal silicon layer, hydrogen is released from the amorphous silicon nitride film including hydrogen by the annealing process and the released hydrogen is diffused into the polycrystal silicon layer to eliminate the defects still remaining in the polycrystal silicon layer.

In the aforementioned hydrogenation method of TFT, a greater part of defects in the polycrystal silicon layer of TFT is eliminated by the hydrogen plasma doping method of the first process but further defects are newly generated by the hydrogenation using hydrogen plasma. In the second process, hydrogen released from the amorphous silicon nitride film including hydrogen is diffused into the polycrystal silicon layer by the annealing process after deposition of the amorphous silicon nitride film including hydrogen to eliminate further defects remaining in the polycrystal silicon layer. Therefore, since the defects newly generated in the first process can be eliminated, defects of the polycrystal silicon layer can be eliminated perfectly.

DESCRIPTION OF THE PREFERRED EMBODIMENT

An embodiment of the present invention will be explained with reference to the process diagrams of the hydrogenation method shown in FIGS. 1A to 1C. In the figures, the hydrogenation of a polycrystal silicon layer to form a channel region of the bottom gate type TFT is illustrated as an example.

Figure 1A:
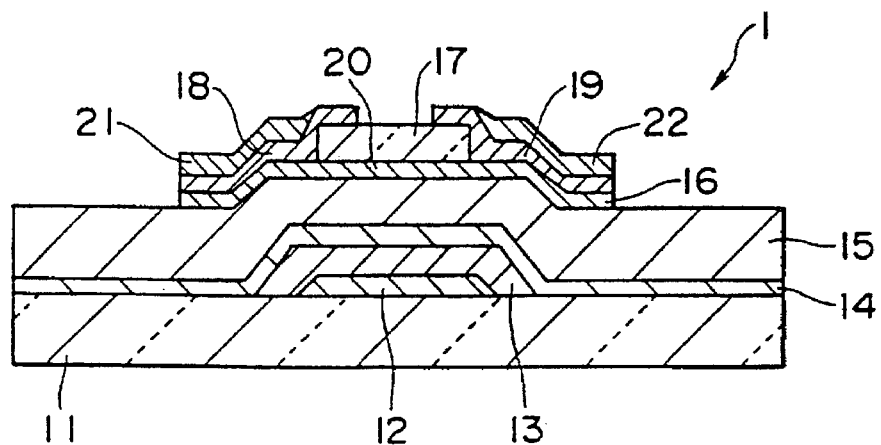
FIGS. 1A to 1C show diagrams for explaining the TFT hydrogenation method illustrating an embodiment of the present invention.

As shown in FIG. 1A, TFT 1 is structured as explained hereunder. That is, a gate electrode 12 consisting of a metal material such as Ta, for example, is formed on a glass substrate 11 and an oxide film ($Ta_2O_5$) 13 is formed by anodic oxidation at the surface of the gate electrode 12. Moreover, a silicon nitride film 14 and a silicon oxide film 15 are stacked covering the anode oxide film 13. On this silicon oxide film 15, a polycrystal silicon layer 16 crystallized by the laser crystallization method is formed.

Furthermore, a stopper layer 17 consisting of silicon oxide is formed on the polycrystal silicon layer 16 at the upper part of the gate electrode 12.

The doped layers 18, 19 which will become the source/drain regions are formed on the polycrystal silicon layer 16 in both sides of the stopper layer 17 and a polycrystal silicon layer 16 at the lower part of the stopper layer 17 becomes a channel region 20. The doped layers 18, 19 are formed, for example, of polycrystal silicon including n-type impurity [phosphorus (P), arsenic (As) or antimony (Sb)].

In addition, the doped layers 18, 19 are connected with the source/drain electrodes 21, 22.

Next, hydrogenation is performed for TFT in the structure explained above.

Figure 1B:
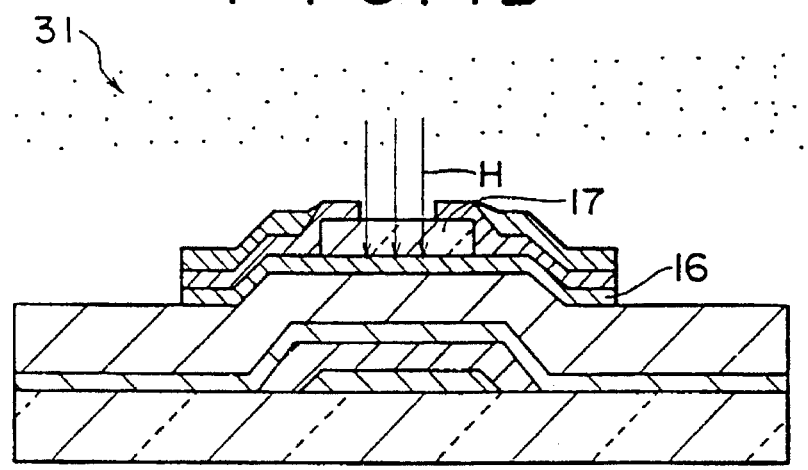

First, the first process shown in FIG. 1B is executed. In this process, hydrogen plasma doping is executed. In this method, hydrogen H in the hydrogen plasma 31 is doped into the polycrystal silicon layer 16 (channel region 20) of TFT 1 through the stopper layer 17 to eliminate a greater part of the defects in the polycrystal silicon layer 16. In this case, other defects are sometimes newly generated within the polycrystal silicon 16 due to the hydrogen plasma.

Figure 1C:
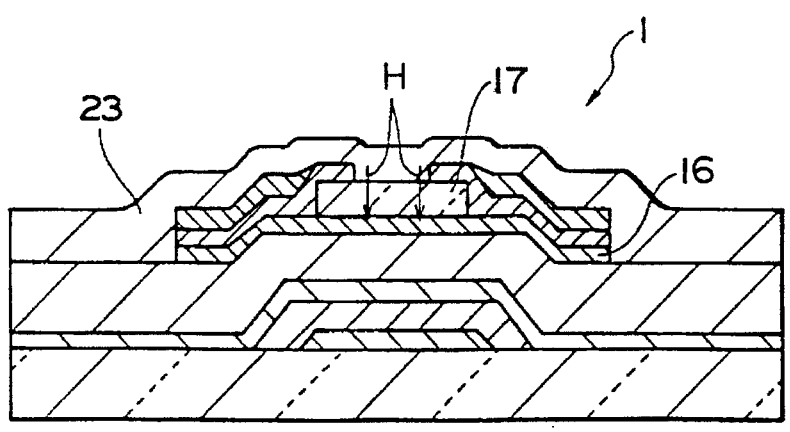

Next, the second process shown in FIG. 1C is executed. In this process, an amorphous silicon nitride film including hydrogen (hereinafter expressed as a-SiNx:H) 23 is formed on the stopper layer 17 on the polycrystal silicon layer 16. This a-SiNx:H film 23 includes hydrogen of the predetermined concentration among the range from several % to 40% and has a function as the passivation film.

Thereafter, hydrogen H is released to the outside from the a-SiNx:H film 23 by the annealing process and such released hydrogen H is then diffused into the polycrystal silicon layer 16 from the interface of the a-SiNx:H film 23 through the stopper layer 17. As a result, the polycrystal silicon layer 16 is hydrogenated.

The aforementioned annealing process can be executed, for example, by the furnace annealing process or the laser annealing process through irradiation of the laser beam.

In the hydrogenation method explained regarding above embodiment, a greater part of the defects generated in the polycrystal silicon layer 16 can be eliminated because hydrogen is doped into the polycrystal silicon 16 of TFT 1.

In the second process, hydrogen is released from the a-SiNx:H film 23 by the annealing process and such released hydrogen H is diffused into the polycrystal silicon layer 16 through the stopper layer 17. Therefore, the remaining defects in the polycrystal silicon layer 16 are eliminated. In this case, the defects newly generated by hydrogen plasma of the first process are also eliminated by the second process. Accordingly, the defects which may be eliminated by hydrogenation can no longer exist within the polycrystal silicon layer 16.

Hydrogenation which may be insufficient only with hydrogen diffusion from the a-SiNx:H film 23 is supplemented previously by the hydrogen plasma doping.

Figure 2:
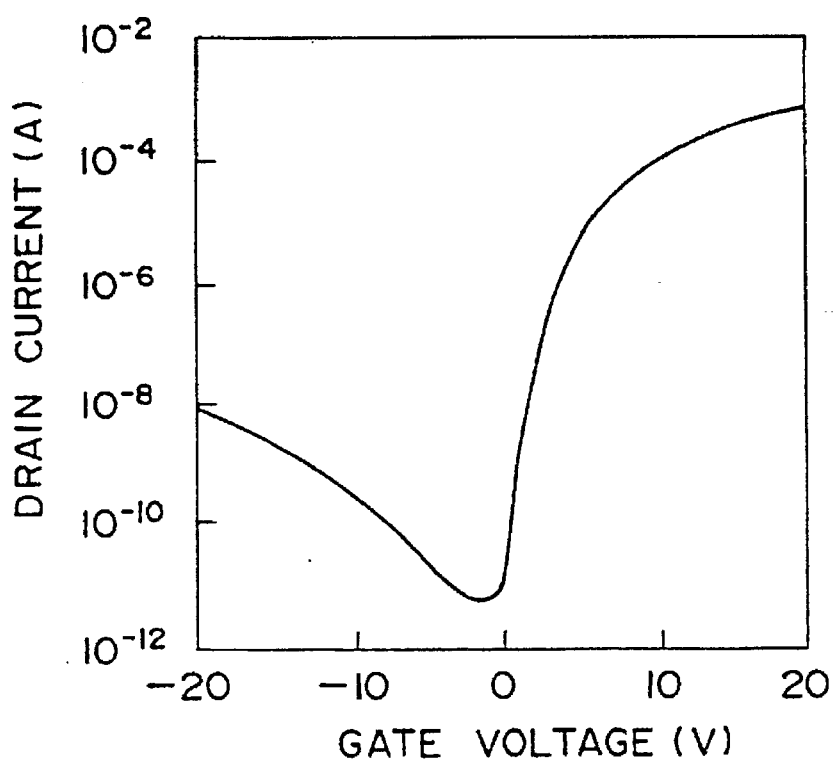
FIG. 2 shows a current—voltage characteristic diagram of TFT after the hydrogenation of the present invention.
Figure 3:
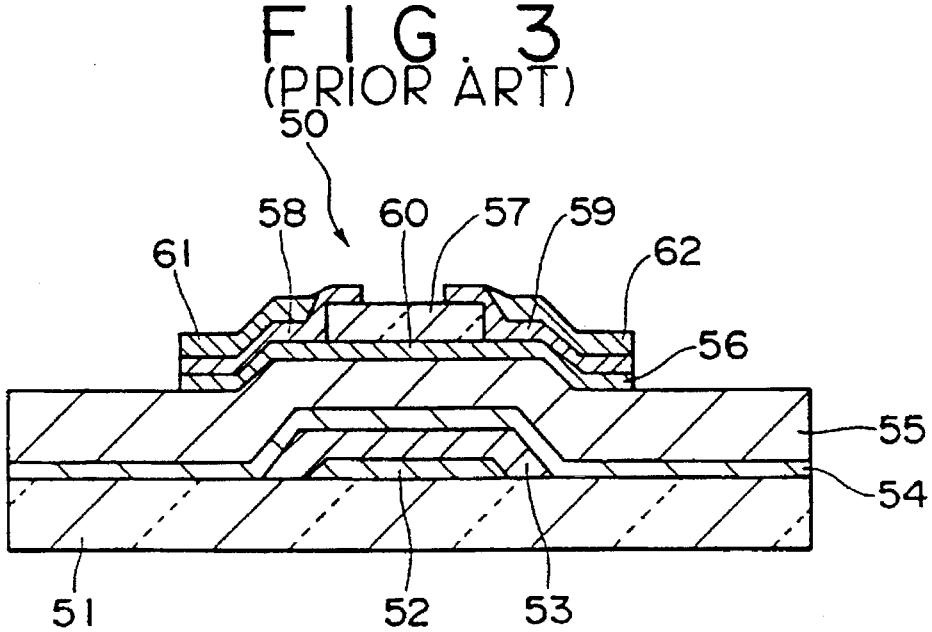
FIG. 3 is a schematic cross-sectional view of TFT of the prior art.
Figure 4:
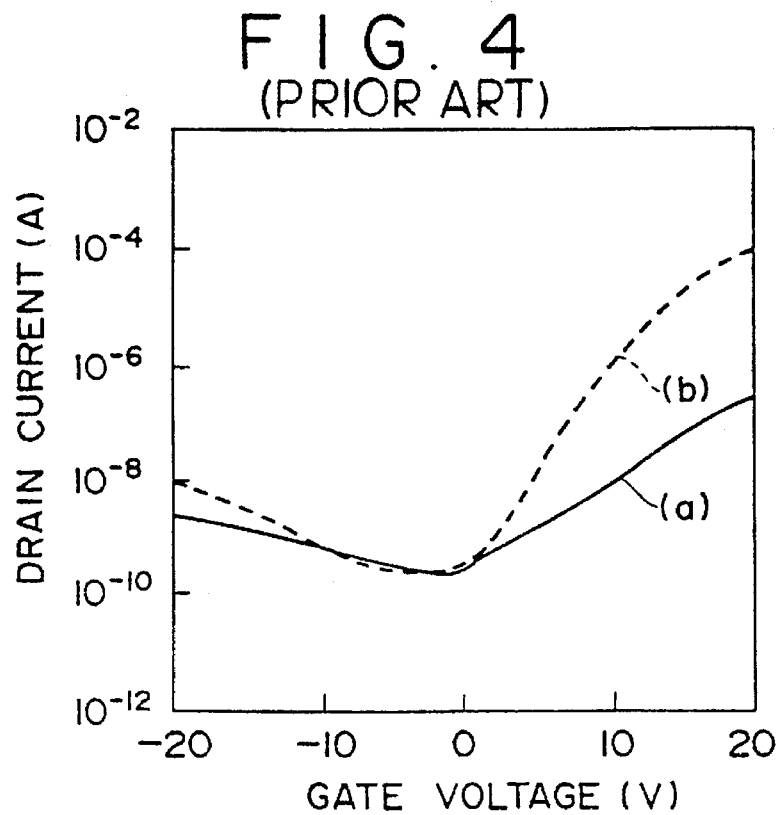
FIG. 4 shows a current—voltage characteristic change diagram of a prior art TFT before and after the hydrogenation.
Figure 5:
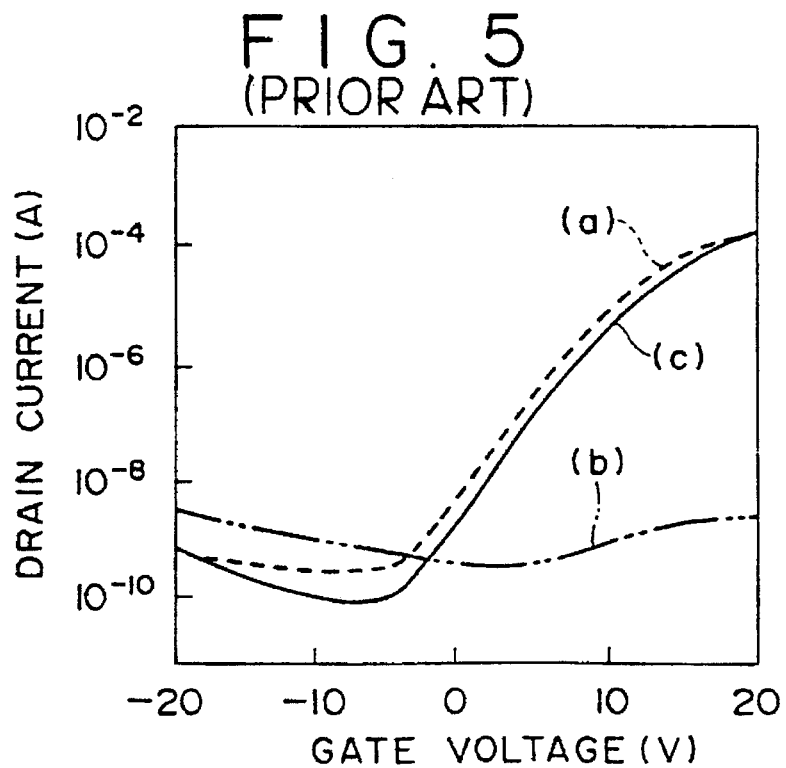
FIG. 5 shows a current—voltage characteristic change diagram of prior art TFTs by irradiation of the ultraviolet ray.

Next, the drain current—gate voltage characteristic (hereinafter described as current—voltage characteristic) of TFT1 after deposition and annealing process of the a-SiNx:H film will then be explained with reference to FIG. 2.

In the figure, a drain current is plotted on the vertical axis, while a gate voltage on the horizontal axis.

As shown in the figure, the ON/OFF current ratio is increased almost by eight orders of magnitude of its original value and a gradient of the drain current—gate voltage curve is also increased. Such current—voltage characteristic is the most excellent characteristic, so long as it is known, of the bottom gate type TFT formed on a glass substrate by the low temperature process.

The hydrogenation method of TFT having the structure of providing a stopper layer consisting of silicon oxide on the polycrystal silicon layer has been explained above, and the hydrogenation method of the present invention can also be applied to the TFT having the structure not providing the stopper layer or the TFT having the top gate structure.

As explained above, according to the present invention, after a greater part of the defects in the polycrystal silicon layer of TFT is eliminated by the hydrogen plasma doping method, hydrogen in the amorphous silicon nitride film including hydrogen is released to diffuse into the polycrystal silicon layer by the annealing process executed after the amorphous silicon nitride film including hydrogen is deposited in view of eliminating the defects remaining in the polycrystal silicon layer. Therefore, defects newly generated by hydrogenation using hydrogen plasma can also be eliminated by diffusion of hydrogen. Accordingly, defects can be eliminated perfectly from the polycrystal silicon layer.

Therefore, the TFT which is hydrogenated by the hydrogenation method of the present invention can provide the most excellent drain current—gate voltage characteristic among those of the bottom gate type TFTs reported in the past. As a result, application of the present invention into the address circuit and clock circuit of LCD and similar devices enables remarkable improvement in such characteristic.

What is claimed is:

1. A method of hydrogenating a polycrystal silicon layer of a thin film transistor comprising:

providing a thin film transistor including a polycrystal silicon layer on a substrate;

doping hydrogen into the polycrystal silicon layer by exposing the thin film transistor to a hydrogen plasma processing;

forming an amorphous silicon nitride film including hydrogen oil the thin film transistor; and annealing to release and diffuse hydrogen from the amorphous silicon nitride film into the doped polycrystal silicon layer to provide a hydrogenated polycrystal silicon layer.

2. A method as defined in claim 1, wherein said thin film transistor further includes a stopper layer on the polycrystal silicon layer and hydrogen is doped and diffused through the stopper layer into the polycrystal silicon layer.

3. A method as defined in claim 1, wherein the thin film transistor is a bottom gate type thin film transistor.

4. A method as defined in claim 1, wherein said annealing step is performed by furnace annealing or by laser annealing.

* * * * *